US010374071B2

(12) United States Patent
Umemoto et al.

(10) Patent No.: US 10,374,071 B2
(45) Date of Patent: Aug. 6, 2019

(54) HETEROJUNCTION BIPOLAR TRANSISTOR

(71) Applicant: MURATA MANUFACTURING CO., LTD., Kyoto-fu (JP)

(72) Inventors: Yasunari Umemoto, Nagaokakyo (JP);
Shigeki Koya, Nagaokakyo (JP);
Shigeru Yoshida, Nagaokakyo (JP);
Isao Obu, Nagaokakyo (JP)

(73) Assignee: MURATA MANUFACTURING CO., LTD., Kyoto-fu (JP)

( * ) Notice: Subject to any disclaimer, the term of this patent is extended or adjusted under 35 U.S.C. 154(b) by 0 days.

(21) Appl. No.: 15/598,456

(22) Filed: May 18, 2017

(65) Prior Publication Data
US 2018/0012979 A1    Jan. 11, 2018

(30) Foreign Application Priority Data
Jul. 11, 2016    (JP) ................. 2016-136965

(51) Int. Cl.
*H01L 29/66*    (2006.01)
*H01L 29/73*    (2006.01)
(Continued)

(52) U.S. Cl.
CPC ...... *H01L 29/7371* (2013.01); *H01L 29/0817* (2013.01); *H01L 29/158* (2013.01); *H01L 29/66318* (2013.01); *H01L 29/66242* (2013.01)

(58) Field of Classification Search
CPC ............ H01L 29/7371; H01L 29/7375; H01L 29/66242; H01L 29/66431; H01L 29/66318; H01L 29/0817; H01L 2924/13051; H01L 2924/13055; H01L 27/0664; H01L 27/0647; H01L 27/1022;
(Continued)

(56) References Cited

U.S. PATENT DOCUMENTS

| 8,219,963 B2 * | 7/2012 | Sakamoto ........... G06F 17/5018 703/2 |
| 2002/0105011 A1 * | 8/2002 | Yaegashi ............... H01L 29/045 257/197 |

(Continued)

FOREIGN PATENT DOCUMENTS

| JP | 2000-068286 A | 3/2000 | |
| JP | 2000124226 A * | 4/2000 | ....... H01L 29/66318 |

(Continued)

OTHER PUBLICATIONS

Shinichi et al., Heterojunction bipolar transistor, 2002, machine translation of JP 2002-076015 by JPO dated Oct. 23, 2017, pp. 1-11.*

*Primary Examiner* — Natalia A Godarenko
(74) *Attorney, Agent, or Firm* — Studebaker & Brackett PC

(57) ABSTRACT

A heterojunction bipolar transistor includes a collector layer, a base layer, an emitter layer, and a semiconductor layer that are laminated in this order, wherein the emitter layer includes a first region having an upper surface on which the semiconductor layer is laminated, and a second region being adjacent to the first region and having an upper surface that is exposed, and the first and second regions of the emitter layer have higher doping concentrations in portions near the upper surfaces than in portions near an interface between the emitter layer and the base layer.

21 Claims, 15 Drawing Sheets

(51) Int. Cl.
*H01L 29/737* (2006.01)
*H01L 29/02* (2006.01)
*H01L 31/109* (2006.01)
*H01L 29/36* (2006.01)
*H01L 31/072* (2012.01)
*H01L 29/08* (2006.01)
*H01L 29/15* (2006.01)
H01L 21/02 (2006.01)
H01L 21/331 (2006.01)

(58) Field of Classification Search
CPC ............... H01L 21/04; H01L 21/331; H01L 21/8222–21/8229; H01L 21/8249; H01L 29/04; H01L 29/0804–29/0834; H01L 29/1004; H01L 29/1008; H01L 29/0649; H01L 29/0696; H01L 29/41708; H01L 29/66265; H01L 29/66295–29/66303; H01L 29/158; H01L 29/66325; H01L 29/66333–29/66348; H01L 29/73–29/7378; H01L 29/732; H01L 29/735; H01L 29/737; H01L 29/739–29/7398; H01L 29/7325; H01L 29/66287; H01L 29/662425; H01L 29/7393–29/7395; H01L 29/7397; H01L 27/0229–27/0244; H01L 27/0262; H01L 27/0263; H01L 27/082–27/0828; H01L 27/102; H01L 27/11801; H01L 27/11896; H01L 27/2445; H01L 31/11; H01L 31/1105; H01L 2924/1305–2924/13056; H01L 29/66234; G06F 17/50; G06F 17/5045; G06F 17/5068
USPC ......... 257/196, 197, 198, 200, 22, 183, 191, 257/201, 565, 591, 583, 578, E29.188, 257/E29, 189, E29.033, E21.371; 438/312–315, 336, 342, 343
See application file for complete search history.

(56) References Cited

U.S. PATENT DOCUMENTS

| | | | |
|---|---|---|---|
| 2004/0089875 A1* | 5/2004 | Yagura | H01L 29/0817 257/183 |
| 2011/0184708 A1* | 7/2011 | Miura-Mattausch | G06F 17/5036 703/2 |
| 2013/0099287 A1* | 4/2013 | Moser | H01L 29/41708 257/197 |
| 2014/0110761 A1* | 4/2014 | Yang | H01L 29/36 257/197 |

FOREIGN PATENT DOCUMENTS

| | | |
|---|---|---|
| JP | 2002-076015 A | 3/2002 |
| JP | 2004-521485 A | 7/2004 |
| JP | 2009-094148 A | 4/2009 |

* cited by examiner

HETEROJUNCTION BIPOLAR TRANSISTOR

CROSS REFERENCE TO RELATED APPLICATIONS

This application claims benefit of priority to Japanese Patent Application 2016-136965 filed Jul. 11, 2016, the entire content of which is incorporated herein by reference.

TECHNICAL FIELD

The present disclosure relates to a heterojunction bipolar transistor.

BACKGROUND

Mobile communication devices such as cellular phones commonly employ heterojunction bipolar transistors (HBTs) in order to amplify the power of radio frequency (RF) signals transmitted to base stations. For example, Japanese Unexamined Patent Application Publication No. 2002-76015 discloses an HBT in which a collector layer, a base layer, and an emitter layer are laminated in this order, and the emitter layer has a doping concentration that is uniform throughout the emitter layer.

SUMMARY

HBTs are in need of an increase in the power-added efficiency. The inventors of the present disclosure studied how to increase the efficiency of HBTs. As a result, they have found that one of the methods for achieving this is to increase the doping concentration of the emitter layer of an HBT to thereby increase the base-emitter capacitance. However, the HBT disclosed in Japanese Unexamined Patent Application Publication No. 2002-76015 (hereafter, also referred to as the existing HBT) is limited in terms of increase in the concentration of the emitter layer by the following three reasons.

First, an increase in the doping concentration without changing the thickness of the emitter layer causes formation of a conductive region in a ledge region (described later) of the emitter layer, which results in a decrease in the current amplification factor. In the ledge region, the thickness $t_s$ of a surface depletion layer satisfies the following formula (1) on the basis of Poisson's equation.

$$\Phi_s = \frac{qN_d t_s^2}{2\varepsilon} \quad (0 \le t_s \le t) \tag{1}$$

where t represents the thickness of the emitter layer (that is, the thickness of the ledge region); $t_s$ represents the thickness of the surface depletion layer in the ledge region; $N_d$ represents the doping concentration of the emitter layer; $\Phi_s$ represents the surface potential of the emitter layer; $\varepsilon$ represents the dielectric constant of the emitter layer; and q represents an electron elementary charge.

The formula (1) is rearranged and the thickness $t_s$ of the surface depletion layer is represented by the following formula (2).

$$t_s = \left(\frac{2\varepsilon\Phi_s}{qN_d}\right)^{\frac{1}{2}} \tag{2}$$

The formula (2) indicates that an increase in the doping concentration $N_d$ results in an increase in the denominator of the right side of the formula, which results in a decrease in the thickness $t_s$ of the surface depletion layer. Thus, when the doping concentration $N_d$ exceeds a predetermined concentration upper limit $N_{dMAX}(t)$, $t_s<t$, that is, the thickness $t_s$ of the surface depletion layer in the ledge region becomes smaller than the thickness t of the ledge region. The concentration upper limit $N_{dMAX}(t)$ of the doping concentration at which the ledge region is fully depleted is represented by the following formula (3), which is obtained by substituting t for $t_s$ in the formula (1).

$$N_{dMAX}(t) = \frac{2\varepsilon\Phi_s}{qt^2} \tag{3}$$

Thus, the attempt of increasing the doping concentration is limited by the concentration upper limit $N_{dMAX}(t)$ calculated by the formula (3).

Second, the formula (3) indicates that a decrease in the thickness t of the emitter layer results in a decrease in the denominator of the right side of the formula, which results in an increase in the concentration upper limit $N_{dMAX}(t)$. However, because the ledge region is provided by etching off portions of laminated layers over the emitter layer, the ledge region needs to have a thickness large enough to tolerate variations in the amount of etching. In addition, when the ledge region is thinner than a predetermined value, it does not provide a function of suppressing an increase in the leakage current due to recombination at the surface of the base layer. When the minimum thickness of the ledge region is represented by $t_{MIN}$, the concentration upper limit $N_{dMAX}$ of the doping concentration satisfies the following formula (4).

$$N_{dMAX}(t_{MIN}) = \frac{2\varepsilon\Phi_s}{qt_{MIN}^2} \tag{4}$$

Specifically, for example, $t_{MIN}$ is about 30 to about 40 nm in general. When thickness $t_{MIN}$=30 nm and $\Phi_s$=0.44 eV, the concentration upper limit $N_{dMAX}(t_{MIN})$ of the doping concentration is calculated as $7.1\times10^{17}$ cm$^{-3}$.

Third, with an increase in the doping concentration $N_d$, application of a reverse voltage across the base and the emitter results in an increase in the intensity of an electric field in a portion (near the base layer) of the emitter layer. This results in a decrease in the base-emitter reverse breakdown voltage.

The present disclosure has been made under these circumstances. Accordingly, it is an object of the present disclosure to provide an HBT that has an increased efficiency while suppressing a decrease in the current amplification factor and a decrease in the base-emitter reverse breakdown voltage.

According to preferred embodiments of the present disclosure, an HBT includes a collector layer, a base layer, an emitter layer, and a semiconductor layer that are laminated in this order, wherein the emitter layer includes a first region having an upper surface on which the semiconductor layer is laminated, and a second region being adjacent to the first region and having an upper surface that is exposed, and the first and second regions of the emitter layer have higher doping concentrations in portions near the upper surfaces than in portions near an interface between the emitter layer and the base layer.

The present disclosure can provide an HBT that has an increased efficiency while suppressing a decrease in the current amplification factor and a decrease in the base-emitter reverse breakdown voltage.

Other features, elements, characteristics and advantages of the present disclosure will become more apparent from the following detailed description of preferred embodiments of the present disclosure with reference to the attached drawings.

DETAILED DESCRIPTION

Figure 1:
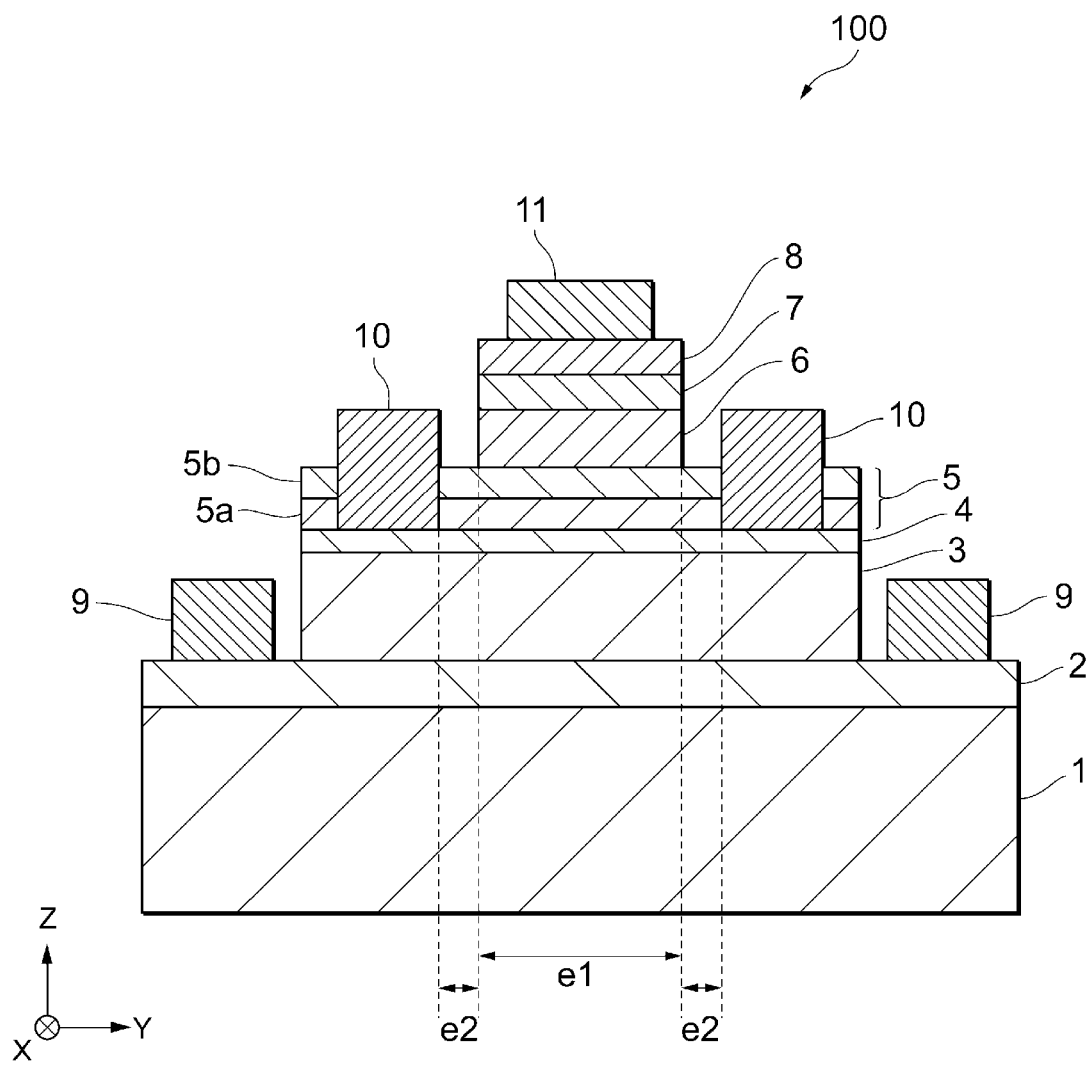
FIG. 1 is a sectional view of an HBT 100 according to a first embodiment of the present disclosure.

Hereinafter, embodiments according to the present disclosure will be described in detail with reference to drawings. Incidentally, like elements are denoted by like reference numerals and redundant descriptions will be omitted.

Figure 2:
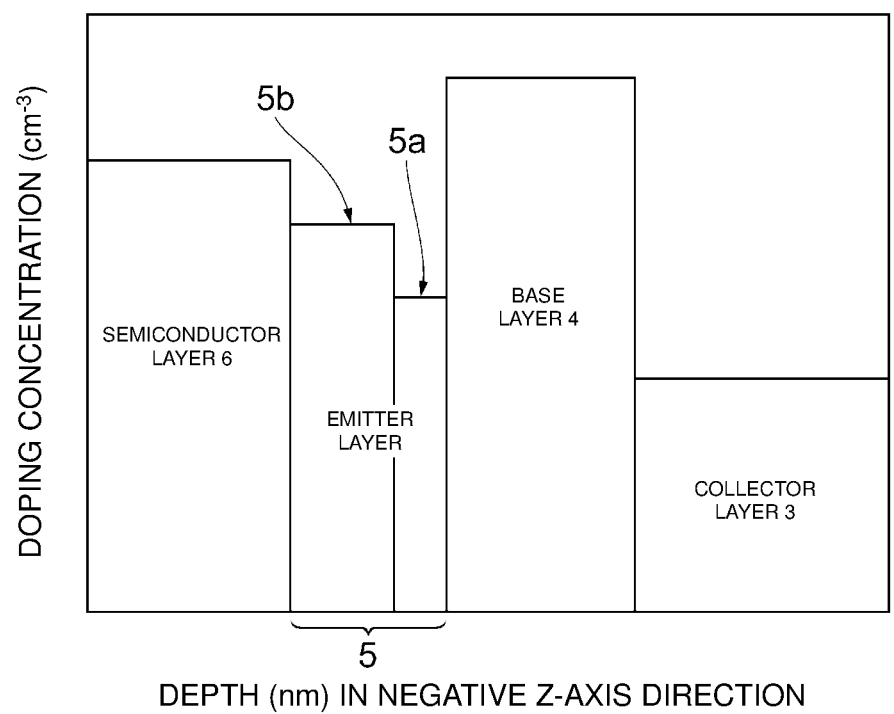
FIG. 2 is a graph illustrating the relationships between layers and their doping concentrations in the HBT 100 according to the first embodiment of the present disclosure.

Referring to FIGS. 1 and 2, an HBT according to a first embodiment of the present disclosure will be described. FIG. 1 is a sectional view of an HBT 100 according to the first embodiment of the present disclosure. FIG. 2 is a graph illustrating the relationships between layers and their doping concentrations in the HBT 100 according to the first embodiment of the present disclosure.

As illustrated in FIG. 1, the HBT 100 is formed on a semiconductor substrate 1. The semiconductor substrate 1 is formed of, for example, GaAs and has a width direction parallel to the Y axis, a longitudinal direction parallel to the X axis, and a thickness direction parallel to the Z axis (refer to FIG. 1). The material for the semiconductor substrate 1 is not limited to GaAs and examples of the material include Si, InP, SiC, and GaN.

On the semiconductor substrate 1, the following layers are laminated in this order in the positive Z-axis direction: a subcollector layer 2, a collector layer 3, a base layer 4, an emitter layer 5, a contact layer 6, a grading layer 7, and a contact layer 8. Incidentally, the features described below, such as materials, doping concentrations, and layer thicknesses, are mere examples and should not be understood as limitations.

The subcollector layer 2 is formed on the semiconductor substrate 1. The material for the subcollector layer 2 is not particularly limited and is, for example, a material having a crystalline structure. The subcollector layer 2, together with the collector layer 3, functions as a collector.

The collector layer 3 is formed on the subcollector layer 2. The material for the collector layer 3 is not particularly limited and is, for example, a material having a crystalline structure. For example, in this embodiment, the subcollector layer 2 and the collector layer 3 contain GaAs as the main component.

Incidentally, the GaAs-containing collector layer 3 as a whole may be an n-type semiconductor or a p-type semiconductor. When the collector layer 3 is an n-type semiconductor, the HBT 100 functions as an npn transistor. When the collector layer 3 is a p-type semiconductor, the HBT 100 functions as a pnp transistor. However, the n-type semiconductor is preferred from the viewpoint of providing good frequency characteristics, compared with the pnp transistor, because GaAs has a hole mobility lower than its electron mobility (electron mobility: about 0.85 m$^2$/Vs, hole mobility: about 0.04 m$^2$/Vs). Hereafter, this embodiment will be described about an example in which the subcollector layer 2 and the collector layer 3 are n-type semiconductors. In order to form the subcollector layer 2 and the collector layer 3 as n-type semiconductors, these layers are doped with a dopant such as Si, S, Se, Te, or Sn. In order to form the subcollector layer 2 and the collector layer 3 as p-type semiconductors, these layers are doped with a dopant such as C, Mg, Be, or Zn. In this embodiment, for example, the subcollector layer 2 has a Si doping concentration of 3×10$^{18}$ cm$^{-3}$ and a thickness of 600 nm, and the collector layer 3 has a Si doping concentration of 1×10$^{16}$ cm$^{-3}$ and a thickness of 950 nm.

The base layer 4 is formed on the collector layer 3. The material for the base layer 4 is not particularly limited. Examples of the material include GaAs, AlGaAs, InGaAs, GaAsSb, GaAsPBi, GaInNAs, GaAsBi, GaAsN, and GaAsBiN. The base layer 4 may have, for example, a multilayer base structure formed of a combination of such materials, or a composition gradient base structure. In this embodiment, for example, the base layer 4 contains, as the main component, GaAs, which is the same material as in the subcollector layer 2 and the collector layer 3.

The main component of the base layer 4, GaAs, may be an n-type semiconductor or a p-type semiconductor. In this embodiment, since the collector layer 3 is an n-type semiconductor, GaAs of the base layer 4 is a p-type semiconductor. The base layer 4 has a C doping concentration of 4×10$^{19}$ cm$^{-3}$ and a thickness of 100 nm.

The emitter layer 5 is formed on the base layer 4. The material for the emitter layer 5 is not particularly limited as long as it is a semiconductor. However, in this embodiment, since the emitter layer 5 and the base layer 4 form a heterojunction, the emitter layer 5 is preferably formed of a semiconductor that contains, as the main component, a material lattice-matching the main component of the base layer 4. For example, the emitter layer 5 is an n-type semiconductor containing, as the main component, InGaP represented by In$_x$Ga$_{1-x}$P where In fraction x=0.5, has a Si doping concentration of 2×10$^{17}$ to 3×10$^{18}$ cm$^{-3}$, and a thickness of 36 nm. Details of the emitter layer 5 will be described later.

On a portion of the emitter layer 5, the following layers are formed in this order: the contact layer 6 (semiconductor layer), the grading layer 7, and the contact layer 8 (hereafter, these layers are also collectively referred to as plural semiconductor layers). The contact layer 6 is, for example, an n-type semiconductor containing GaAs as the main component, has a Si doping concentration of 3×10$^{18}$ cm$^{-3}$, and a thickness of 90 nm. The grading layer 7 is, for example, an n-type semiconductor containing, as the main component, InGaAs where In fraction x=0 to 0.5, has a Si concentration of 1×10$^{19}$ cm$^{-3}$, and a thickness of 50 nm. The contact layer 8 is, for example, an n-type semiconductor containing, as the main component, InGaAs where In fraction x=0.5, has a Si concentration of 1×10$^{19}$ cm$^{-3}$, and a thickness of 50 nm. These plural semiconductor layers are formed on a portion of the upper surface of the emitter layer 5 (the upper surface is a main surface on the positive Z-axis direction side of the emitter layer 5). Thus, in this embodiment, each of the main surfaces (parallel to the XY-axis plane) of the plural semiconductor layers has a smaller area than a main surface (parallel to the XY-axis plane) of the emitter layer 5. Incidentally, the HBT may not contain any one of the contact layer 6, the grading layer 7, and the contact layer 8, and may contain a semiconductor layer other than these plural semiconductor layers.

Collector electrodes 9 are formed as a pair on the subcollector layer 2 in the width direction (Y-axis direction) of the subcollector layer 2 such that the collector layer 3 is positioned between the collector electrodes 9. Alternatively, a collector electrode 9 may be formed on the subcollector layer 2 so as to be on any one of the sides of the collector layer 3. The material for the collector electrodes 9 is not particularly limited, and is AuGe/Ni/Au, for example. In this embodiment, the collector electrodes 9 have a structure of AuGe (layer thickness: 60 nm)/Ni (layer thickness: 10 nm)/Au (layer thickness: 200 nm). Incidentally, the symbol "/" represents a laminated structure. For example, AuGe/Ni means a structure in which a Ni layer is laminated on a AuGe layer. The same applies to the following descriptions.

A base electrode 10 is formed on the base layer 4. The material for the base electrode 10 is not particularly limited, and is Ti/Pt/Au, for example. In this embodiment, the base electrode 10 has a structure of Ti (layer thickness: 50 nm)/Pt (layer thickness: 50 nm)/Au (layer thickness: 200 nm).

An emitter electrode 11 is formed on the contact layer 8. The material for the emitter electrode 11 is not particularly limited, and is Mo/Ti/Pt/Au, WSi, or AuGe/Ni/Au, for example. In this embodiment, the emitter electrode 11 is formed of WSi (Si fraction: 0.3, layer thickness: 300 nm).

Hereinafter, referring to FIG. 2, the emitter layer 5 will be described in detail. Incidentally, in the graph of FIG. 2, the ordinate axis indicates the doping concentration (cm$^{-3}$) of each layer; and the abscissa axis indicates a depth (nm) in the HBT 100, in the negative Z-axis direction, from the upper surface of the contact layer 6 (the upper surface is a main surface on the positive Z-axis direction side of the contact layer 6).

In this embodiment, the emitter layer 5 is constituted by two layers. Specifically, the emitter layer 5 (thickness t=36 nm) includes a lower layer 5a (thickness $t_L$=16 nm) and an upper layer 5b (thickness $t_H$=20 nm), which are laminated in this order from the base layer 4 side of the emitter layer 5. The lower layer 5a and the upper layer 5b have different doping concentrations. The upper layer 5b has a doping concentration $N_{dH}$ higher than the doping concentration $N_{dL}$ of the lower layer 5a (refer to FIG. 2). For example, the lower layer 5a may have a doping concentration $N_{dL}$ (that is, the doping concentration of a portion near the interface between the emitter layer 5 and the base layer 4) of 3.2×10$^{17}$ cm$^{-3}$, while the upper layer 5b may have a doping concentration $N_{dH}$ (that is, the doping concentration of a portion near the upper surface of the emitter layer 5) of 8.8×10$^{17}$ cm$^{-3}$. However, the doping concentrations and thicknesses of the lower layer 5a and the upper layer 5b are not limited to these examples.

The upper surface of the emitter layer 5 (the upper surface is a main surface on the positive Z-axis direction side of the emitter layer 5) has a first region e1 on which the contact layer 6, the grading layer 7, and the contact layer 8 are laminated in this order, and a second region e2 being adjacent to the first region e1 and having an exposed upper surface of the emitter layer 5 without having the plural semiconductor layers thereon. The second region e2 of the emitter layer 5 is a region including a surface depletion layer (hereafter, referred to as a ledge region) that is depleted in accordance with the doping concentration and surface potential of the emitter layer 5. The ledge region protects and stabilizes the upper surface of the base layer 4, to thereby suppress an increase in the leakage current due to recombination at the surface, to avoid a decrease in the current amplification factor due to the increase. In this embodiment, the depletion layer formed in the ledge region extends to the interface between the emitter layer 5 and the base layer 4. Thus, the ledge region is maintained to be fully depleted. Hereinafter, this full depletion will be described.

The doping concentration and thickness of the lower layer are respectively represented by $N_{dL}$ and $t_L$; the doping concentration and thickness of the upper layer are respectively represented by $N_{dH}$ and $t_H$; and the thickness of the surface depletion layer in the ledge region is represented by $t_s$. The thickness $t_s$ of the surface depletion layer satisfies the following formula (5) on the basis of Poisson's equation.

$$\Phi_s = \frac{qN_{dH}t_H^2}{2\varepsilon} + \frac{qN_{dL}(t_s^2 - t_H^2)}{2\varepsilon} \quad (t_H \leq t_s \leq t) \tag{5}$$

In the formula (5), when $t_s=t$, the ledge region is fully depleted. Thus, the doping concentration $N_{dH}$ of the upper layer at which full depletion is achieved satisfies the following formula (6).

$$\Phi_s = \frac{qN_{dH}t_H^2}{2\varepsilon} + \frac{qN_{dL}(t^2 - t_H^2)}{2\varepsilon} \tag{6}$$

Furthermore, when the doping concentration $N_{dH}$ of the upper layer satisfies the following formula (7), the ledge region is maintained to be fully depleted.

$$\Phi_s \geq \frac{qN_{dH}t_H^2}{2\varepsilon} + \frac{qN_{dL}(t^2 - t_H^2)}{2\varepsilon} \tag{7}$$

When the equal sign of the formula (7) is valid (that is, the formula (6) is valid), the doping concentration $N_{dH}$ of the upper layer is the concentration upper limit $N_{dMAX}(t)$. Comparison between the above formulae (3) and (6) indicates the following. The thickness $t_H$ of the upper layer and the doping concentration $N_{dL}$ of the lower layer are decreased to sufficiently small values, so that the concentration upper limit $N_{dMAX}(t)$ of the doping concentration of the upper layer satisfying the formula (6) becomes higher than the concentration upper limit $N_{dMAX}(t)$ of the doping concentration of the emitter layer in the formula (3). In other words, compared with the existing HBT, the concentration upper limit $N_{dMAX}(t)$ of the doping concentration can be increased while the ledge region is maintained to be fully depleted.

Figure 3:
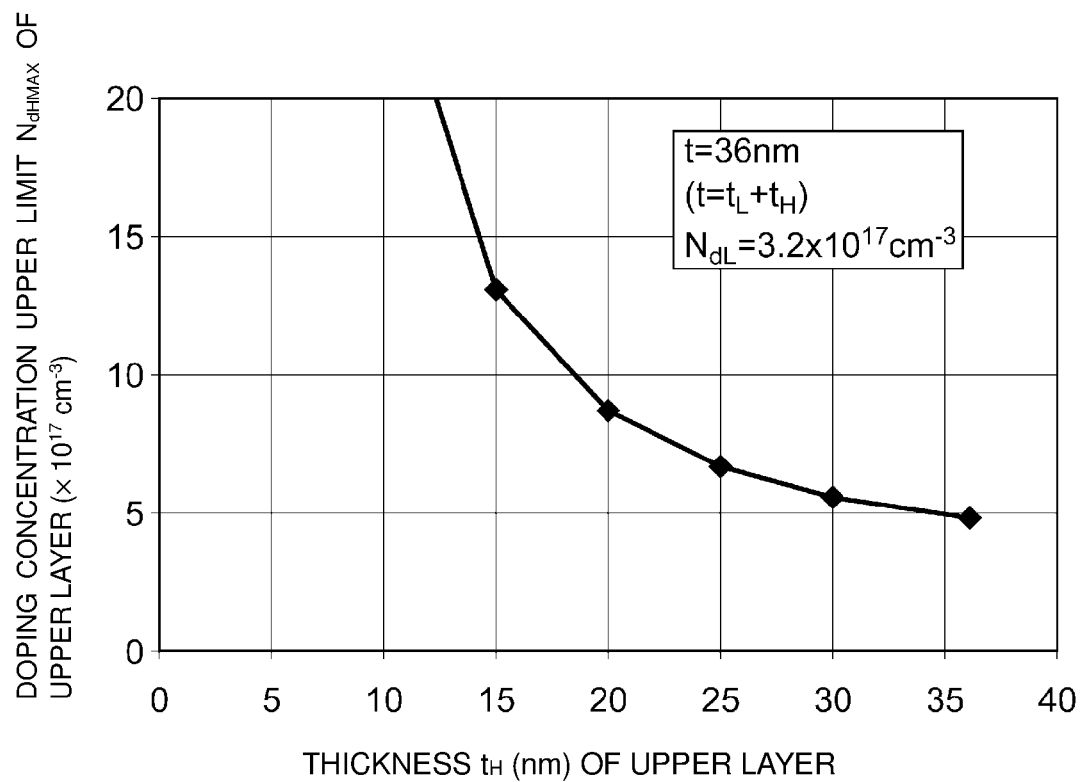
FIG. 3 is a graph illustrating an example of the simulation result of the relationship between the thickness $t_H$ of an upper layer and the concentration upper limit $N_{dHMAX}$ of the doping concentration of the upper layer in the HBT 100 according to the first embodiment of the present disclosure.

FIG. 3 is a graph illustrating an example of the simulation result of the relationship between the thickness $t_H$ of the upper layer and the concentration upper limit $N_{dMAX}$ of the doping concentration of the upper layer in the HBT 100 according to the first embodiment of the present disclosure. The graph of FIG. 3 illustrates the result of calculating the concentration upper limit $N_{dMAX}(t)$ of the doping concentration of the upper layer by the formula (6) when the thickness t of the whole emitter layer is 36 nm, the doping concentration $N_{dL}$ of the lower layer is $3.2 \times 10^{17}$ cm$^{-3}$, and the thickness $t_H$ of the upper layer is 15 nm, 20 nm, 25 nm, 30 nm, or 36 nm. The ordinate axis indicates the concentration upper limit $N_{dMAX}(\times 10^{17}$ cm$^{-3})$ of the doping concentration of the upper layer. The abscissa axis indicates the thickness $t_H$ (nm) of the upper layer.

As illustrated in FIG. 3, compared with the concentration upper limit of the doping concentration of the existing HBT (that is, $N_{dMAX}(t)$ when $t_H=36$ nm), the concentration upper limit $N_{dMAX}(t)$ of the doping concentration is high in this embodiment in which the emitter layer has a bilayer structure of the upper layer and the lower layer. FIG. 3 also indicates that, the smaller the thickness $t_H$ of the upper layer, the higher the concentration upper limit $N_{dMAX}(t)$ of the doping concentration of the upper layer.

As has been described, in this embodiment, the lower layer 5a, which has a lower doping concentration than the upper layer 5b, is formed in the emitter layer 5. As a result, the surface depletion layer in the ledge region spreads in the low-doping-concentration direction (that is, the base layer 4 side of the emitter layer 5) to thereby maintain the ledge region to be fully depleted. Thus, while generation of a conductive region in the ledge region is avoided, the doping concentration of the emitter layer can be increased beyond the concentration upper limit of the doping concentration of the emitter layer of the existing HBT. As a result, the base-emitter capacitance of the HBT is increased, so that the HBT has an increased efficiency.

In addition, the doping concentration of the emitter layer can be increased without requiring any decrease from the thickness t of the emitter layer of the existing HBT. Thus, the thickness of the emitter layer can be set equal to or more than the minimum thickness $t_{MIN}$ of the existing HBT, so that the thickness falls within the range of values that tolerate etching-caused variations in the thickness of the emitter layer. In addition, the function of the ledge region is maintained, to thereby avoid a decrease in the current amplification factor. Incidentally, in this embodiment, when the emitter layer has a minimum thickness determined by limitations of processing (for example, $t_{MIN}$=30 nm), even when the doping concentration is set equal to or more than the concentration upper limit of the doping concentration of the existing HBT (for example, $N_{dMAX}(t_{MIN})$=about $7.1 \times 10^{17}$ cm$^{-3}$), the ledge region can be maintained to be fully depleted (refer to the formula (6)). Specifically, for example, the upper layer preferably has a doping concentration of $7.5 \times 10^{17}$ cm$^{-3}$ or more.

In addition, the doping concentration of the lower layer can be set lower than the doping concentration in the existing HBT. Thus, during application of a reverse voltage across the base and the emitter, the intensity of an electric field on the base layer side of the emitter layer is decreased. Accordingly, a decrease in the base-emitter reverse breakdown voltage can be suppressed.

Figure 4:
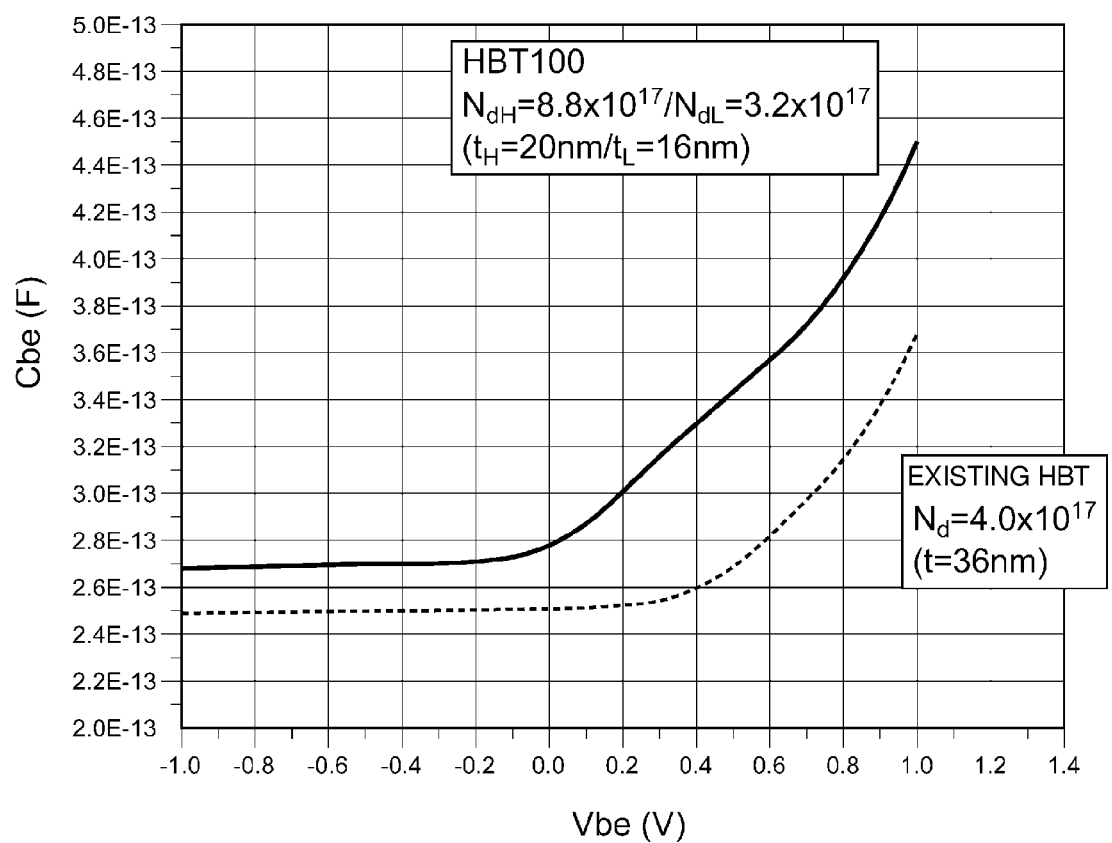
FIG. 4 is a graph illustrating an example of the simulation result of the relationship between the base-emitter voltage Vbe and the base-emitter capacitance Cbe of the HBT 100 according to the first embodiment of the present disclosure.

FIG. 4 is a graph illustrating an example of the simulation result of the relationship between the base-emitter voltage Vbe and the base-emitter capacitance Cbe in the HBT 100 according to the first embodiment of the present disclosure. The graph of FIG. 4 illustrates the simulation result of the base-emitter capacitance Cbe in the HBT 100 (doping concentration $N_{dH}$ of the upper layer=$8.8 \times 10^{17}$ cm$^{-3}$, doping concentration $N_{dL}$ of the lower layer=$3.2 \times 10^{17}$ cm$^{-3}$, thickness $t_H$ of the upper layer=20 nm, thickness $t_L$ of the lower layer=16 nm) and in the existing HBT (doping concentration $N_d$=$4.0 \times 10^{17}$ cm$^{-3}$, thickness t of the emitter layer=36 nm). The ordinate axis indicates the base-emitter capacitance (F) of HBTs. The abscissa axis indicates the base-emitter voltage (V) of HBTs.

As illustrated in FIG. 4, because the HBT 100 is produced such that the emitter layer is divided into a lower layer and an upper layer, and the doping concentration $N_{dH}$ of the upper layer is made higher than the doping concentration of the emitter layer of the existing HBT, the base-emitter capacitance Cbe of the HBT 100 is increased with respect to any base-emitter voltage Vbe, compared with the existing HBT. In addition, as illustrated in FIG. 3, when the upper layer has a thickness $t_H$ of 20 nm, the concentration upper limit $N_{dHMAX}$ of the doping concentration of the upper layer is $8.8 \times 10^{17}$ cm$^{-3}$. Thus, in this embodiment, the ledge region is fully depleted.

The above simulation results indicate that, in this embodiment, while the ledge region is maintained to be fully depleted, the base-emitter capacitance of the HBT is increased. Incidentally, the increase in the base-emitter capacitance Cbe results in an increase (for example, an increase of about 1.5%) in the power-added efficiency of the HBT, compared with the existing HBT.

Hereinafter, referring to FIGS. 5A to 5D, a method for producing the HBT 100 according to the first embodiment of the present disclosure will be described. FIGS. 5A to 5D illustrate steps of the method for producing the HBT 100 according to the first embodiment of the present disclosure. FIGS. 5A to 5D are illustrated in the same direction as in the sectional view of the HBT 100 in FIG. 1. Incidentally, details of the materials for the elements are the same as in the above descriptions for the HBT 100 and hence will be omitted in the following description.

Figure 5A:
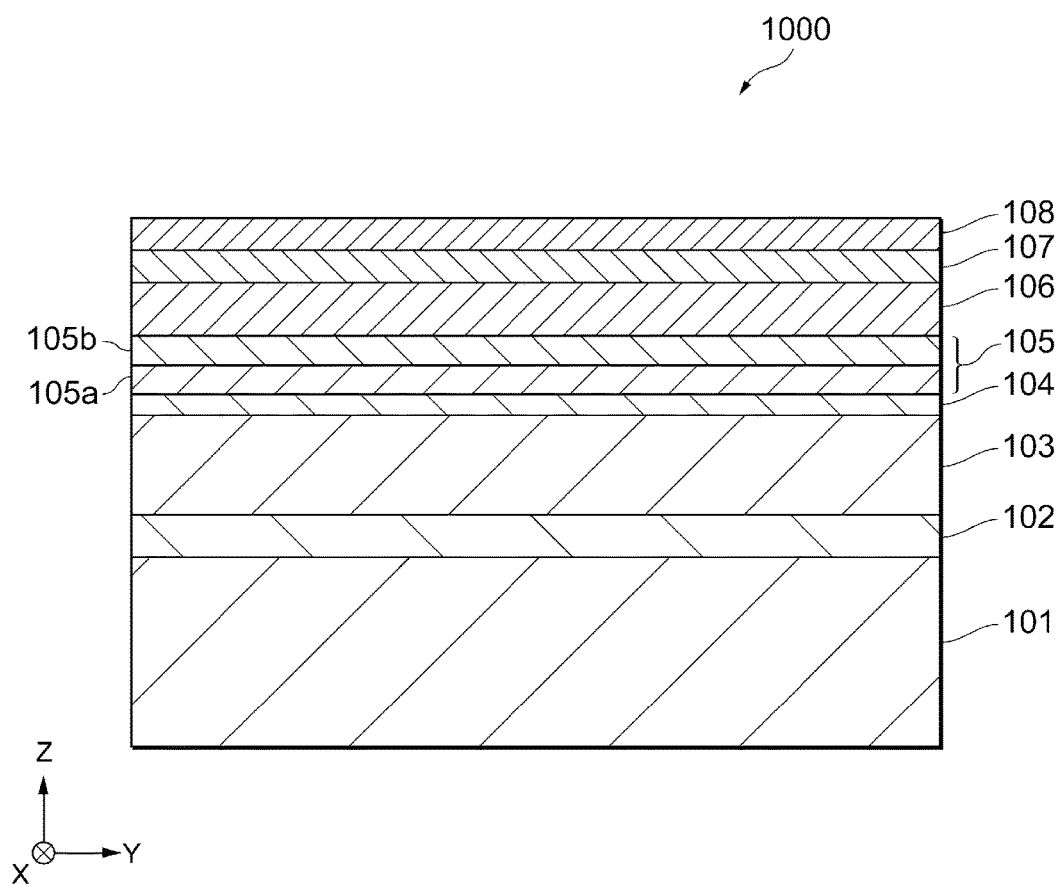
FIG. 5A illustrates a step of a method for producing the HBT 100 according to the first embodiment of the present disclosure.

Referring to FIG. 5A, on a semiconductor substrate 101, the following layers are laminated in this order: a subcollector layer 102, a collector layer 103, a base layer 104, a lower layer 105a of an emitter layer 105, an upper layer 105b of the emitter layer 105, a contact layer 106, a grading layer 107, and a contact layer 108. Thus, a laminated member 1000 is obtained. The layers are laminated by, for example, an epitaxial growth process such as MOCVD (Metal Organic Chemical Vapor Deposition). In general, an n-type semiconductor layer is formed by doping with Si, and a p-type semiconductor layer is formed by doping with C. The contact layer 108 may be doped with, for example, Se or Te.

Figure 5B:
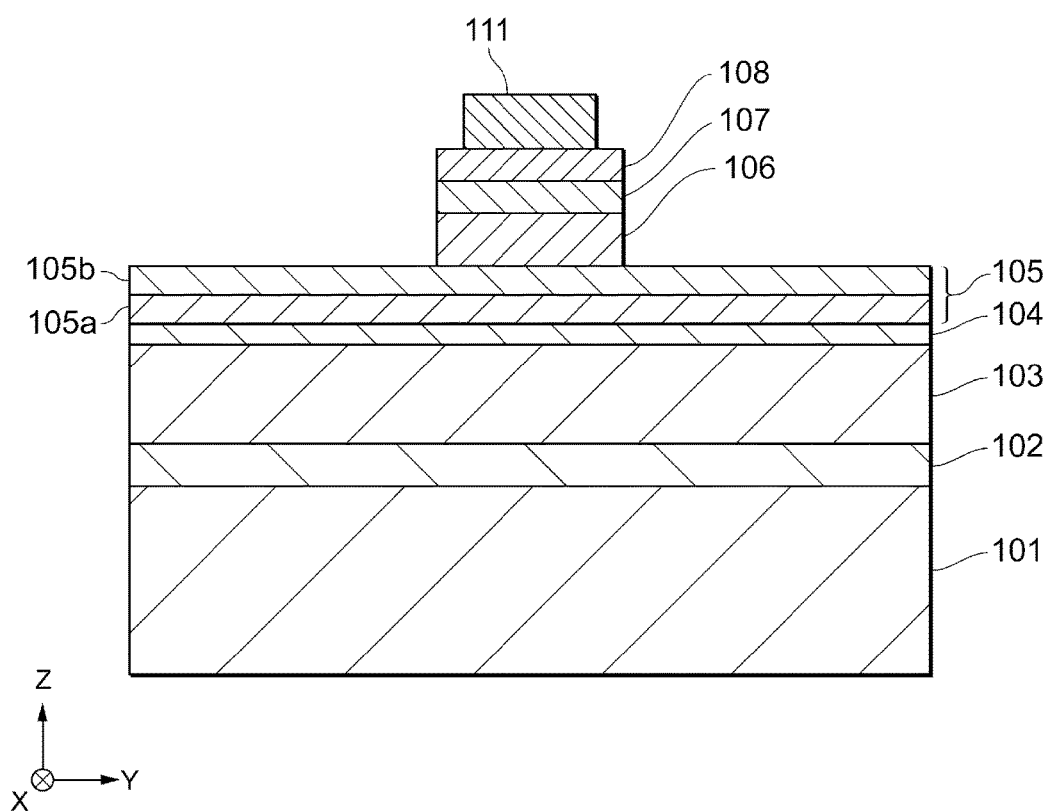
FIG. 5B illustrates a step of a method for producing the HBT 100 according to the first embodiment of the present disclosure.
Figure 5C:
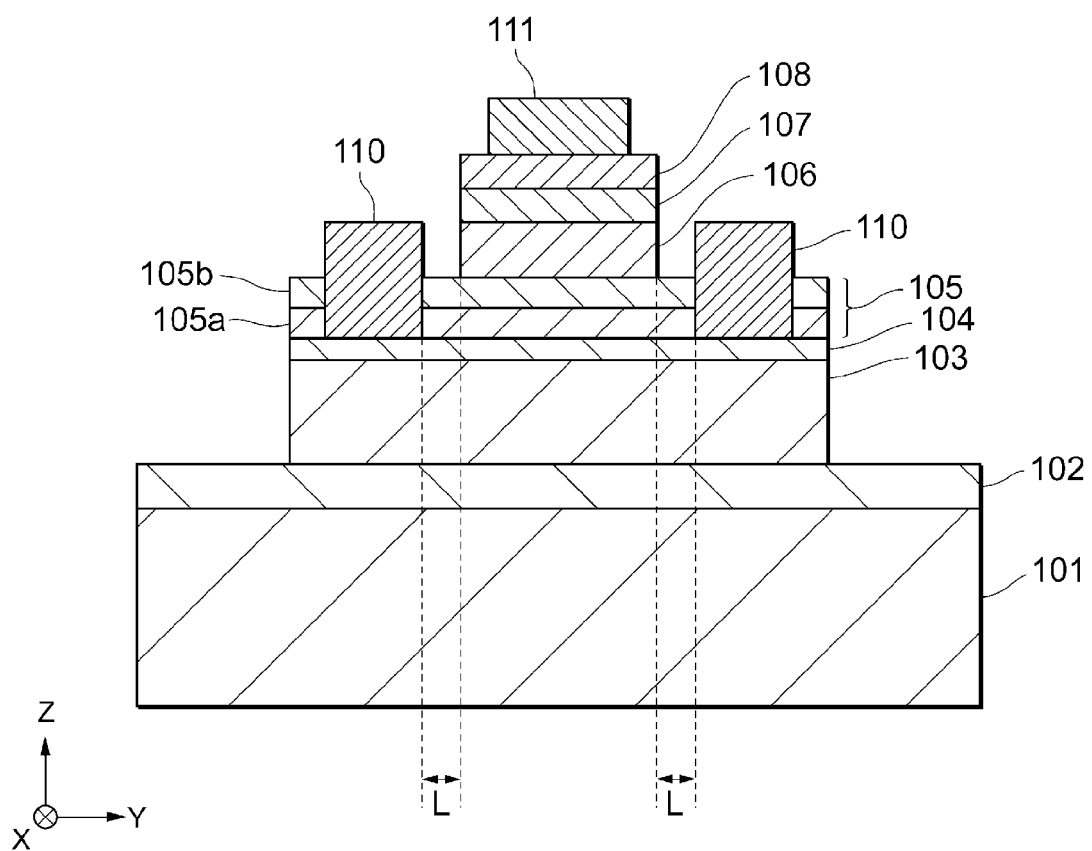
FIG. 5C illustrates a step of a method for producing the HBT 100 according to the first embodiment of the present disclosure.

Subsequently, referring to FIG. 5B, an emitter electrode 111 is formed on the upper surface of the contact layer 108. The contact layer 108, the grading layer 107, and the contact layer 106 are partially etched off through a predetermined photoresist mask (not shown) as the etching mask. These layers are etched by, for example, a selective etching treatment in which the upper layer 105b is left. The layers are thus etched to form a mesa region constituted by the contact layer 108, the grading layer 107, and the contact layer 106.

Subsequently, the photoresist mask is stripped to expose the surface of the upper layer 105b of the emitter layer 105. This exposure of the upper layer 105b causes generation of a surface potential Φs. Thus, a ledge region L will be formed in a later step. Incidentally, the value of the surface potential Φs is substantially governed by the material for the emitter layer 105, and is also slightly influenced by the process used for the etching treatment (for example, a wet etching process or a dry etching process), or the type or formation method of a passivation film 112 (refer to FIG. 5D), which covers the surface of the ledge region L.

Subsequently, another photoresist mask (not shown) is formed for patterning layers including the emitter layer 105 and the base layer 104. Subsequently, referring to FIG. 5C, the emitter layer 105, the base layer 104, and the collector layer 103 are etched through the photoresist mask as the etching mask. This forms a mesa region constituted by the emitter layer 105, the base layer 104, and the collector layer 103. The photoresist mask is then stripped.

Subsequently, a portion of the emitter layer 105 is removed to expose the base layer 104, the portion corresponding to a region where a base electrode 110 is to be formed. The base electrode 110 is then formed so as to be in contact with the base layer 104. Alloying treatment is performed to form an ohmic contact between the base electrode 110 and the base layer 104.

Figure 5D:
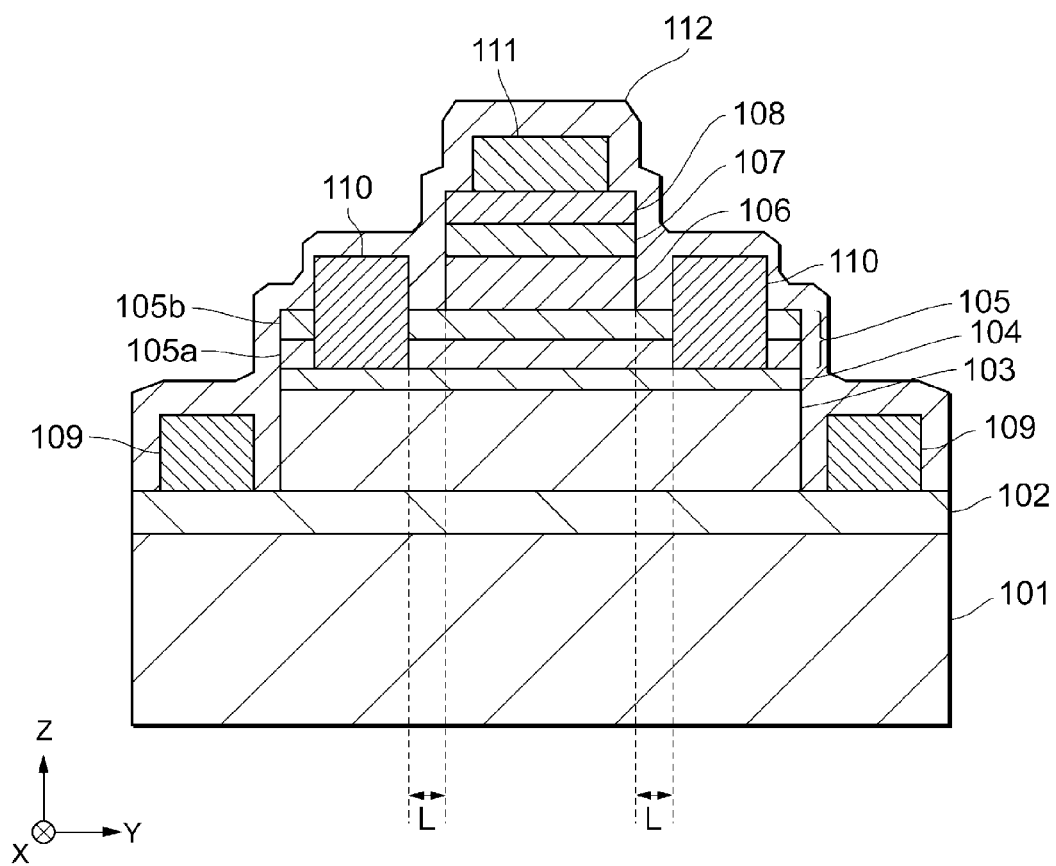
FIG. 5D illustrates a step of a method for producing the HBT 100 according to the first embodiment of the present disclosure.

Subsequently, referring to FIG. 5D, collector electrodes 109 are formed so as to be in contact with the subcollector layer 102. Alloying treatment is performed to form ohmic contacts between the collector electrodes 109 and the subcollector layer 102. Finally, the passivation film 112 is formed on the surface of the HBT. Thus, the main part of the heterojunction bipolar transistor has been formed. The passivation film is, for example, a SiN film. Once the passivation film 112 is formed, the surface potential Φs of the ledge region L becomes substantially fixed to a value and is substantially not influenced by subsequent steps.

Hereinafter, referring to FIGS. 6 to 8, specific configurations of the upper layer and the lower layer according to this embodiment in terms of doping concentration and thickness will be described in detail.

Figure 6:
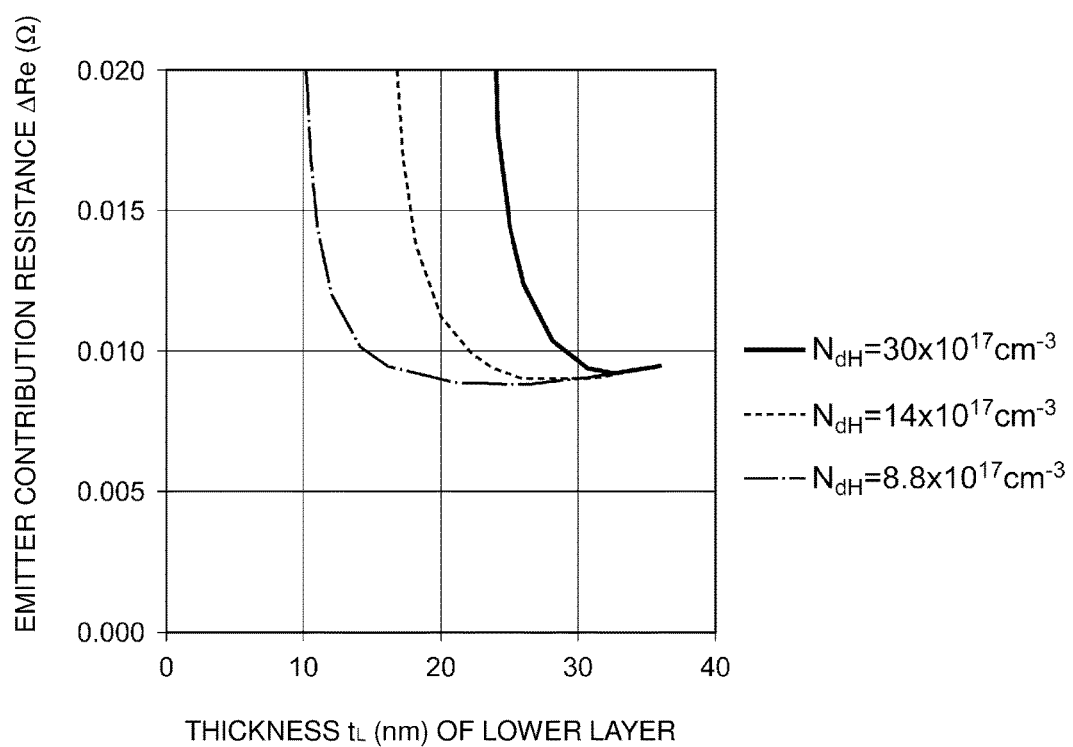
FIG. 6 is a graph illustrating an example of the simulation result of the relationship between the thickness $t_L$ of a lower layer and an emitter contribution resistance ΔRe in the HBT 100 according to the first embodiment of the present disclosure.

FIG. 6 is a graph illustrating an example of the simulation result of the relationship between the thickness ti, of the lower layer of the emitter layer and an emitter contribution resistance ΔRe in the HBT 100 according to the first embodiment of the present disclosure. The graph of FIG. 6 illustrates the emitter contribution resistance ΔRe when the doping concentration $N_{dH}$ of the upper layer of the emitter layer of the HBT 100 is $8.8 \times 10^{17}$ cm$^{-3}$, $14 \times 10^{17}$ cm$^{-3}$, or $30 \times 10^{17}$ cm$^{-3}$. The ordinate axis indicates the emitter contribution resistance ΔRe (Ω) of the HBT 100. The abscissa axis indicates the thickness $t_L$ (nm) of the lower layer. The emitter contribution resistance ΔRe means, out of the total of values of resistance of the laminated layers between the emitter electrode 11 and the base layer 4, the value of resistance attributed to the emitter layer 5.

As illustrated in FIG. 6, when the thickness $t_L$ of the lower layer is smaller than a predetermined thickness, the emitter contribution resistance ΔRe sharply increases, which results in degradation of the HBT performance. The reason for this is as follows: even when the lower layer has a small thickness $t_L$, in order to maintain the ledge region to be fully depleted, the doping concentration $N_{dL}$ of the lower layer needs to be decreased (refer to the formula (6)); however, a decrease in the doping concentration $N_{dL}$ beyond a predetermined value results in an increase in the value of resistance. Accordingly, in order to avoid degradation of the HBT performance, the lower layer is preferably formed with a thickness $t_L$ equal to or more than a predetermined thickness. Specifically, when the upper layer has a sufficiently high doping concentration $N_{dH}$, the lower layer is preferably formed with a thickness $t_L$ that is equal to or more than one sixth of the thickness t of the whole emitter layer.

Figure 7:
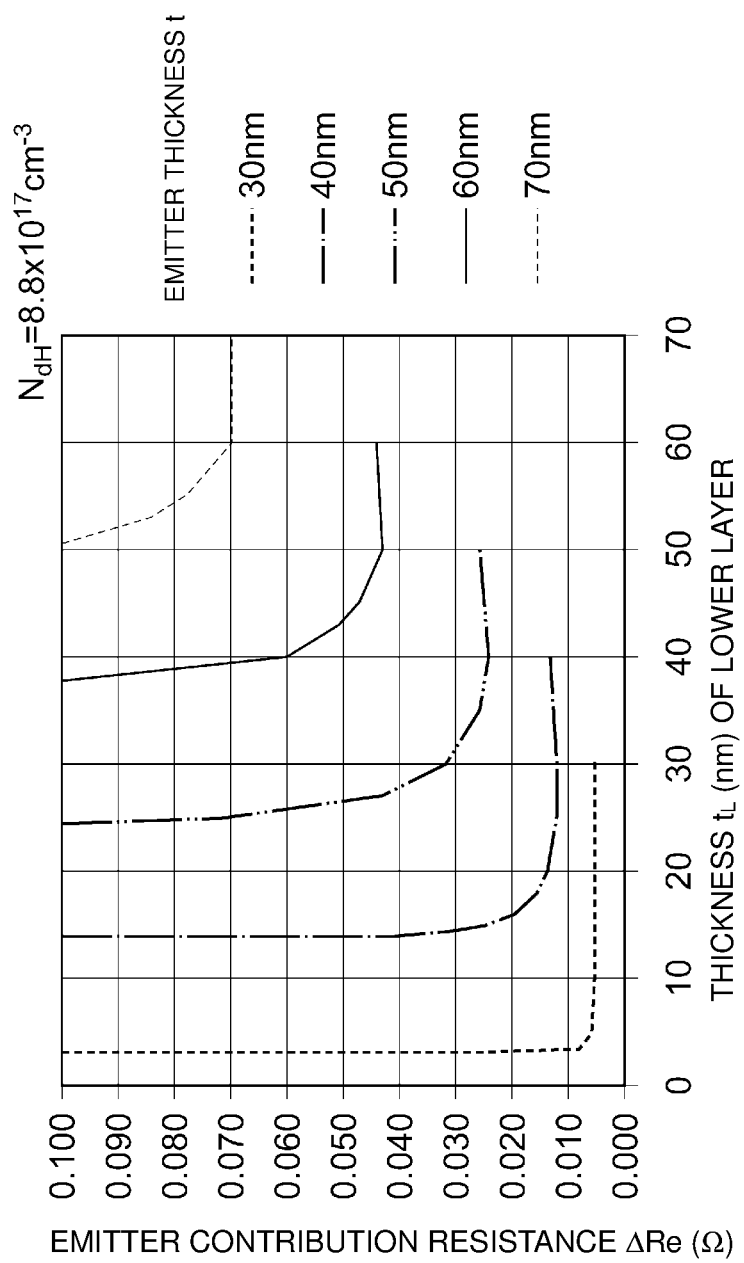
FIG. 7 is a graph illustrating an example of the simulation result of the relationship between the thickness $t_L$ of a lower layer and an emitter contribution resistance ΔRe in the HBT 100 according to the first embodiment of the present disclosure.

FIG. 7 is a graph illustrating an example of the simulation result of the relationship between the thickness $t_L$ of the lower layer and the emitter contribution resistance ΔRe in the HBT 100 according to the first embodiment of the present disclosure. The graph of FIG. 7 illustrates the relationships between the thickness $t_L$ of the lower layer and the emitter contribution resistance ΔRe in the HBT 100 when the thickness t of the whole emitter layer in the HBT 100 satisfies t=30 nm, 40 nm, 50 nm, 60 nm, or 70 nm. Incidentally, the doping concentration $N_{dH}$ of the upper layer of the HBT 100 is $8.8 \times 10^{17}$ cm$^{-3}$. The ordinate axis indicates the emitter contribution resistance ΔRe (Ω) of the HBT 100. The abscissa axis indicates the thickness $t_L$ (nm) of the lower layer.

As illustrated in FIG. 7, in the emitter layer with a thickness t being fixed, when the thickness $t_L$ of the lower layer is increased beyond a predetermined thickness, the emitter contribution resistance ΔRe converges to a substantially constant value. This constant value increases with an increase in the thickness t of the emitter layer, toward the emitter contribution resistance ΔRe=0.1Ω. In addition, an increase in the thickness t of the emitter layer results in an increase in the rate of increase in the emitter contribution resistance ΔRe. For example, when t is more than 60 nm, the rate of increase is considerably high (refer to FIG. 7). The emitter resistance per 100 μm² of the emitter is, in general, about 0.5 to about 1.5Ω. An increase in the rate of increase in the emitter contribution resistance ΔRe influences degradation of the HBT performance. Thus, the thickness t of the emitter layer of the HBT is preferably 20 nm or more and 60 nm or less, more preferably 20 nm or more and 40 nm or less. This enables avoidance of degradation of the HBT performance, and enhancement of the effect of increasing the efficiency of the HBT due to an increase in the doping concentration of the emitter layer.

Figure 8:
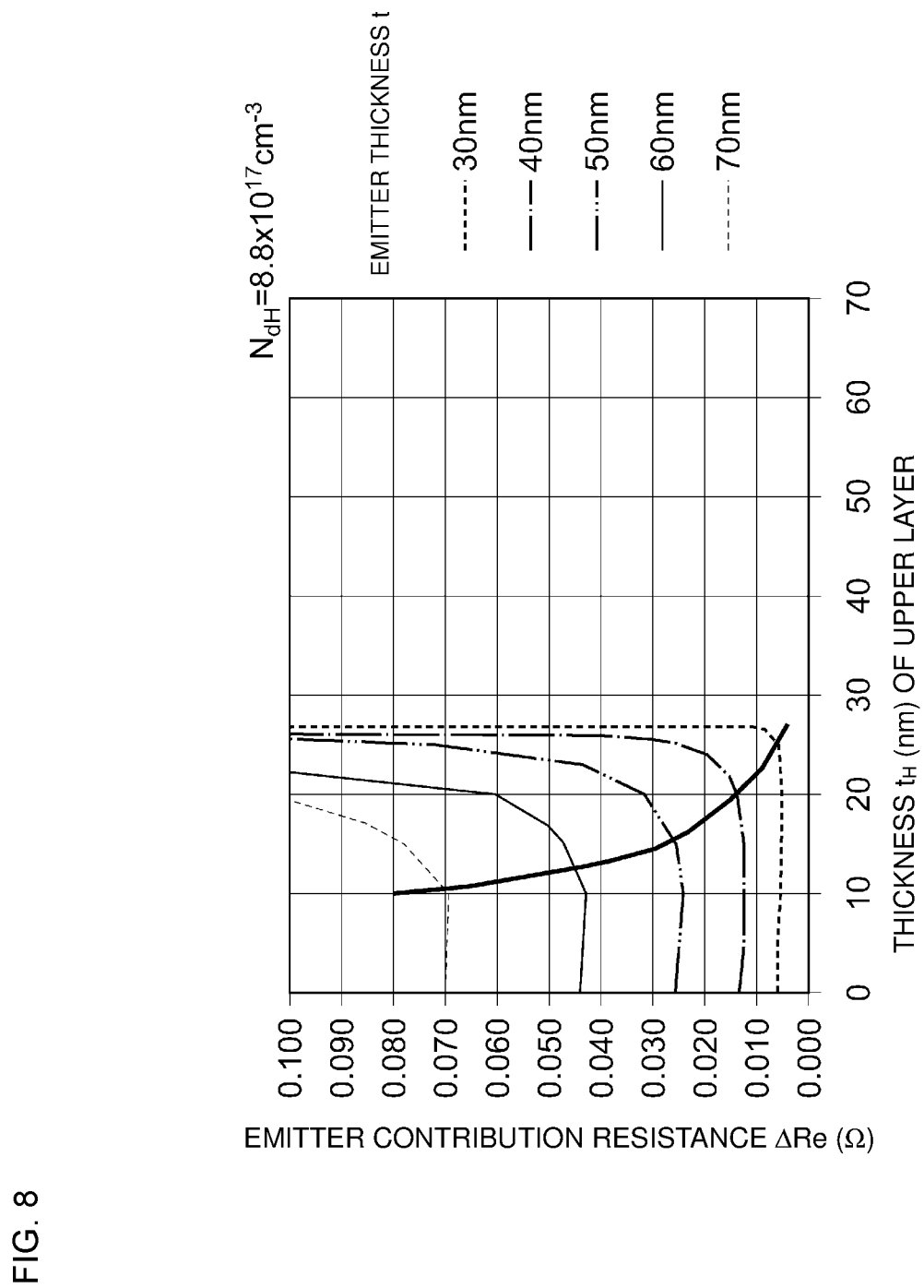
FIG. 8 is a graph illustrating an example of the simulation result of the relationship between the thickness $t_H$ of an upper layer and an emitter contribution resistance ΔRe in the HBT 100 according to the first embodiment of the present disclosure.

FIG. 8 is a graph illustrating an example of the simulation result of the relationship between the thickness $t_H$ of the upper layer and the emitter contribution resistance $\Delta Re$ in the HBT 100 according to the first embodiment of the present disclosure. The graph of FIG. 8 illustrates the relationships between the thickness $t_H$ of the upper layer and the emitter contribution resistance $\Delta Re$ in the HBT 100 when the thickness t of the whole emitter layer of the HBT 100 satisfies t=30 nm, 40 nm, 50 nm, 60 nm, or 70 nm. Incidentally, the doping concentration $N_{dH}$ of the upper layer of the HBT 100 is $8.8 \times 10^{17}$ cm$^{-3}$. The ordinate axis indicates the emitter contribution resistance $\Delta Re$ ($\Omega$) of the HBT. The abscissa axis indicates the thickness $t_H$ (nm) of the upper layer.

As illustrated in FIG. 8, in the HBT 100, regardless of the thickness t of the emitter layer, when the thickness $t_H$ of the upper layer is equal to or more than a predetermined thickness (for example, in the case of t=30 nm, $t_H$=27 nm or more), the emitter contribution resistance $\Delta Re$ sharply increases, which results in degradation of the HBT performance. Thus, the thickness $t_H$ of the upper layer is preferably a predetermined value or less. For example, when the thickness t of the emitter layer is 30 nm or more and 70 nm or less, the thickness $t_H$ of the upper layer is preferably 5 nm or more and 26/(t/30) nm (corresponding to the thick line in FIG. 8) or less.

The thickness $t_{Hcrit}$ of the upper layer at which the emitter contribution resistance $\Delta Re$ sharply increases corresponds to the thickness $t_H$ of the upper layer when the doping concentration $N_{dL}$ of the lower layer is zero (that is, $N_{dL}$=0) and the ledge region is fully depleted. Thus, the thickness $t_{Hcrit}$ satisfies the following formula (8), which is obtained by substituting 0 for $N_{dL}$ in the above formula (5).

$$t_{Hcrit} = \left( \frac{2\varepsilon \Phi_s}{qN_{dH}} \right)^{\frac{1}{2}} \tag{8}$$

Thus, when $t_H > t_{Hcrit}$, even in the presence of the lower layer, there are no positive doping concentrations $N_{dL}$ (>0) at which the ledge region is fully depleted. Thus, the thickness $t_H$ of the upper layer preferably satisfies the following formula (9).

$$t_H \leq t_{Hcrit} \tag{9}$$

Figure 9:
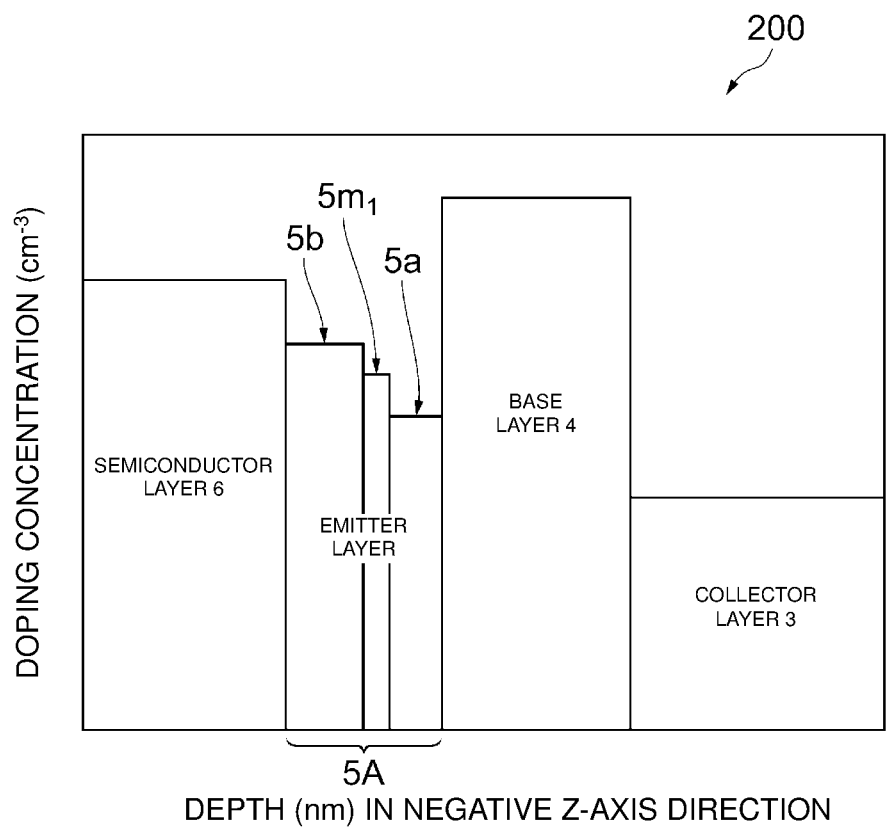
FIG. 9 is a graph illustrating the relationships between layers and their doping concentrations in an HBT 200 according to a modification of the first embodiment of the present disclosure.

FIG. 9 is a graph illustrating the relationships between layers and their doping concentrations in an HBT 200 according to a modification of the first embodiment of the present disclosure. In the graph of FIG. 9, the ordinate axis indicates the doping concentration (cm$^{-3}$) of each layer; and the abscissa axis indicates a depth (nm) in FIG. 1, in the negative Z-axis direction, from the upper surface of the contact layer 6 (the upper surface is a main surface on the positive Z-axis direction side of the contact layer 6).

Compared with the HBT 100 in FIG. 1, the HBT 200 further includes, in an emitter layer 5A, an intermediate layer $5m_1$ between a lower layer 5a and an upper layer 5b.

As illustrated in FIG. 9, the doping concentration of the intermediate layer $5m_1$ is higher than the doping concentration of the lower layer 5a and lower than the doping concentration of the upper layer 5b. Specifically, for example, the doping concentrations of the lower layer 5a (thickness: 16 nm), the intermediate layer $5m_1$ (thickness: 4 nm), and the upper layer 5b (thickness: 16 nm) are respectively $3.2 \times 10^{17}$ cm$^{-3}$, $5 \times 10^{17}$ cm$^{-3}$, and $8.8 \times 10^{17}$ cm$^{-3}$. In other words, the emitter layer 5A is formed such that a portion near the interface between the emitter layer 5A and the base layer 4 has a relatively low concentration, a portion near the upper surface of the emitter layer 5A has a relatively high concentration, and the doping concentration is gradually increased from the base layer 4 side to the contact layer 6 (semiconductor layer) side of the emitter layer 5A. The intermediate layer $5m_1$ may have a doping concentration in the range of, for example, about $2 \times 10^{17}$ to about $9 \times 10^{17}$ cm$^{-3}$.

A position in the emitter layer in the depth direction (Z-axis direction) is represented by x (the origin of x is defined at the upper surface of the emitter layer 5 (the lower surface of the contact layer 6)). The doping concentration distribution of the emitter layer is represented by N(x). When the doping concentration distribution of the emitter layer is not uniform, in general, the thickness $t_s$ of the surface depletion layer in the ledge region satisfies the following formula (10).

$$\Phi_s = \int_0^{t_s} \int_x^{t_s} \left( \frac{qN(x')}{\varepsilon} \right) dx' dx \, (0 \leq t_s \leq t) \tag{10}$$

In the formula (10), in the case of $t_s$=t where the ledge region is fully depleted, the doping concentration distribution N(x) of the emitter layer satisfies the following formula (11).

$$\Phi_s = \int_0^t \int_x^t \left( \frac{qN(x')}{\varepsilon} \right) dx' dx \tag{11}$$

Thus, when the doping concentration distribution N(x) satisfies the following formula (12), the ledge region is maintained to be fully depleted.

$$\Phi_s \geq \int_0^t \int_x^t \left( \frac{qN(x')}{\varepsilon} \right) dx' dx \tag{12}$$

The emitter layer 5A in the HBT 200 can be formed so as to have a doping concentration distribution N(x) satisfying the formula (12). Thus, as in the HBT 100, even when the contact layer 6 side of the emitter layer is formed so as to have a higher concentration than the emitter layer in the existing HBT (for example, about $8.8 \times 10^{17}$ cm$^{-3}$), because of the presence of the lower layer 5a having a low concentration on the base layer 4 side of the emitter layer 5A, the ledge region is maintained to be fully depleted. In other words, even when the emitter layer is constituted by three layers, the concentration upper limit of the doping concentration of the emitter layer can be increased, compared with the existing HBT. Thus, the base-emitter capacitance of the HBT can be increased, which results in an increase in the efficiency of the HBT.

The emitter layer is thus changed from the bilayer structure to the trilayer structure, to thereby enhance the degree of freedom of designing the concentration distribution. For example, the doping concentration of the intermediate layer $5m_1$ is adjusted such that the doping concentration of the upper layer is higher than the doping concentration of the upper layer in HBT 100, to thereby further increase the base-emitter capacitance Cbe. Specifically, compared with the HBT 100, the power-added efficiency is further increased by about 0.3% to about 0.5%.

Incidentally, the number of layers within the emitter layer is not limited to two or three, and may be four or more. When the emitter layer is constituted by four or more layers, as in the HBTs 100 and 200, the emitter layer is also preferably formed so as to have a doping concentration distribution N(x) in which the doping concentration is gradually increased from the base layer 4 side toward the contact layer 6 side of the emitter layer.

Figure 10:
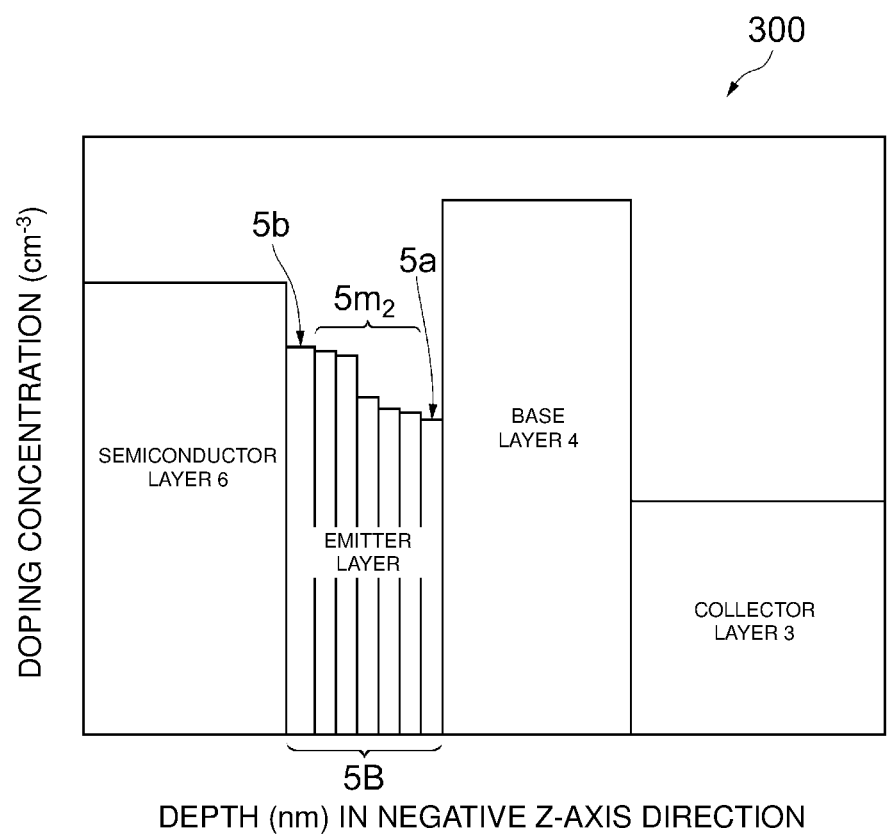
FIG. 10 is a graph illustrating the relationships between layers and their doping concentrations in an HBT 300 according to another modification of the first embodiment of the present disclosure.

FIG. 10 is a graph illustrating the relationships between layers and their doping concentrations in an HBT 300 according to another modification of the first embodiment of the present disclosure. In the graph of FIG. 10, the ordinate axis indicates the doping concentration (cm$^{-3}$) of each layer; and the abscissa axis indicates a depth (nm) in FIG. 1, in the negative Z-axis direction, from the upper surface of the contact layer 6 (the upper surface is a main surface on the positive Z-axis direction side of the contact layer 6).

The HBT 300 is an example in which an intermediate layer within the emitter layer is divided into plural layers. Specifically, an emitter layer 5B is constituted by a lower layer 5a (lower region) having a relatively low concentration, an upper layer 5b (upper region) having a relatively high concentration, and an intermediate layer $5m_2$ (intermediate region) constituted by plural layers (for example, five layers) between the lower layer 5a and the upper layer 5b. As in the HBT 200, the emitter layer 5B is formed so as to have a doping concentration distribution N(x) in which the doping concentration is gradually increased from the base layer 4 side toward the contact layer 6 side of the emitter layer 5B.

The intermediate region containing the intermediate layer $5m_2$ is formed so as to have a higher gradient of the doping concentration than the contact layer 6 side region (upper region) and the base layer 4 side region (lower region) (refer to FIG. 10). In this case, the doping concentration distribution N(x) is similar to the distribution of the emitter layer 5 of the HBT 100 (that is, the emitter layer having a bilayer structure). Thus, the ledge region is maintained to be fully depleted, and the base-emitter reverse breakdown voltage is increased.

Figure 11:
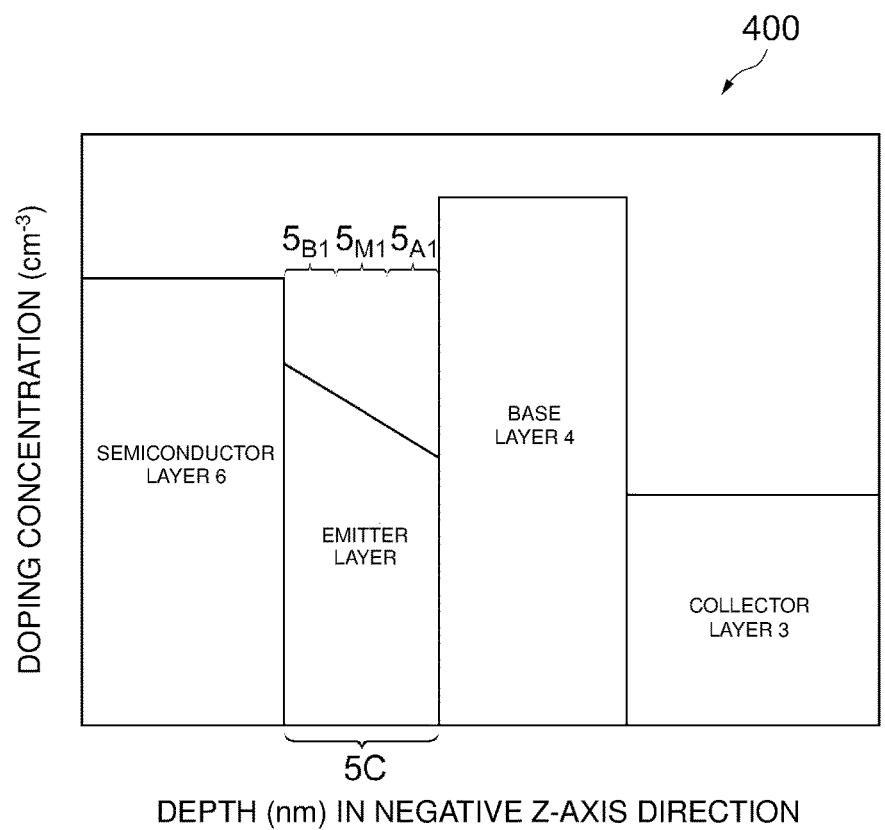
FIG. 11 is a graph illustrating the relationships between layers and their doping concentrations in an HBT 400 according to a second embodiment of the present disclosure.

FIG. 11 is a graph illustrating the relationships between layers and their doping concentrations of an HBT 400 according to a second embodiment of the present disclosure. In the graph of FIG. 11, the ordinate axis indicates the doping concentration (cm$^{-3}$) of each layer; and the abscissa axis indicates a depth (nm) in FIG. 1, in the negative Z-axis direction, from the upper surface of the contact layer 6 (the upper surface is a main surface on the positive Z-axis direction side of the contact layer 6).

Compared with the HBT 100 in FIG. 1, the HBT 400 includes, instead of the emitter layer including the lower layer 5a and the upper layer 5b, an emitter layer 5C (concentration gradient layer) whose doping concentration continuously changes.

As illustrated in FIG. 11, the emitter layer 5C is formed such that the doping concentration is continuously (for example, substantially linearly) increased from the base layer 4 side toward the contact layer 6 side of the emitter layer 5C. Specifically, the emitter layer 5C includes a lower region $5_{A1}$ on the base layer 4 side, an upper region $5_{B1}$ on the contact layer 6 side, and an intermediate region $5_{M1}$ between the lower region $5_{A1}$ and the upper region $5_{B1}$. The lower region $5_{A1}$ (that is, in the emitter layer 5C, a portion near the interface between the emitter layer 5C and the base layer 4) is formed so as to have a relatively low concentration (for example, $2\times10^{17}$ to $5\times10^{17}$ cm$^{-3}$). The upper region $5_{B1}$ (that is, in the emitter layer 5C, a portion near the upper surface of the emitter layer 5C) is formed so as to have a relatively high concentration (for example, $6\times10^{17}$ to $30\times10^{17}$ cm$^{-3}$).

In this embodiment, as in the HBTs 200 and 300, the doping concentration distribution N(x) can be formed so as to satisfy the formula (12). Thus, the ledge region is maintained to be fully depleted, and the base-emitter capacitance Cbe is increased.

The emitter layer is thus changed from the plural layers to the concentration gradient layer whose concentration continuously changes, to thereby enhance the degree of freedom of designing the doping concentration distribution N(x). For example, the doping concentration of the intermediate region $5_{M1}$ is adjusted such that the doping concentration of the upper region $5_{B1}$ is higher than the doping concentration of the upper layer in the HBT 100, to thereby further increase the base-emitter capacitance Cbe. Specifically, compared with the HBT 100, the power-added efficiency is further increased by about 0.5% to about 1%.

Figure 12:
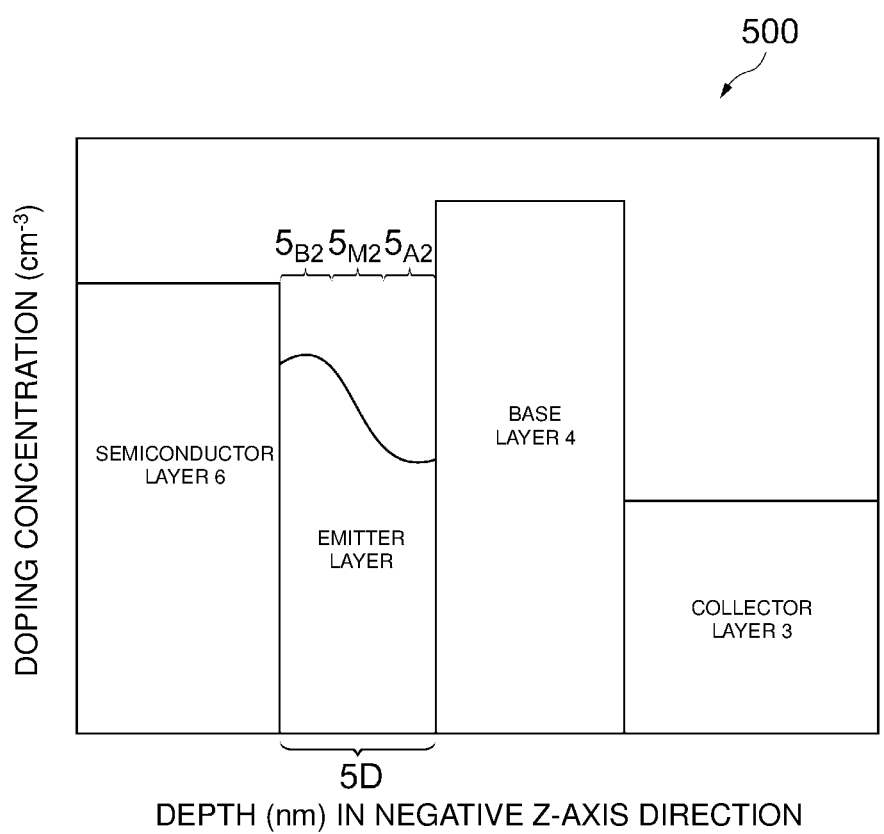
FIG. 12 is a graph illustrating the relationships between layers and their doping concentrations in an HBT 500 according to a modification of the second embodiment of the present disclosure.

FIG. 12 is a graph illustrating the relationships between layers and their doping concentrations in an HBT 500 according to a modification of the second embodiment of the present disclosure. In the graph of FIG. 12, the ordinate axis indicates the doping concentration (cm$^{-3}$) of each layer; and the abscissa axis indicates a depth (nm) in FIG. 1, in the negative Z-axis direction, from the upper surface of the contact layer 6 (the upper surface is a main surface on the positive Z-axis direction side of the contact layer 6).

Compared with the HBT 400 in FIG. 11, the HBT 500 includes, instead of the emitter layer 5C, an emitter layer 5D. The emitter layer 5D includes a lower region $5_{A2}$ on the base layer 4 side, an upper region $5_{B2}$ on the contact layer 6 side, and an intermediate region $5_{M2}$ between the lower region $5_{A2}$ and the upper region $5_{B2}$. Unlike the HBT 400 in FIG. 11, the emitter layer 5D is formed such that the gradient of the doping concentration in the intermediate region $5_{M2}$ is higher than the gradients of the doping concentrations of the lower region $5_{A2}$ and the upper region $5_{B2}$. Thus, the doping concentration distribution N(x) is similar to the distribution of the emitter layer 5 (that is, the emitter layer having the bilayer structure) of the HBT 100. Accordingly, the ledge region is maintained to be fully depleted, and the base-emitter reverse breakdown voltage is increased.

As described above, the gradient of the doping concentration in the emitter layer is not necessarily linear and may be partially concave or convex as long as the doping concentration is substantially maintained to incline.

Thus, exemplary embodiments according to the present disclosure have been described. In each of the HBTs 100, 200, 300, 400, and 500, a collector layer, a base layer, an emitter layer, and a semiconductor layer are laminated in this order, and the emitter layer has a higher doping concentration in a portion near the upper surface of the emitter layer than in a portion near the interface between the emitter layer and the base layer. Thus, even when the doping concentration of the emitter layer is made higher than the concentration upper limit $N_{dMAX}(t)$ of the emitter layer of the existing HBT, the ledge region is maintained to be fully depleted. Accordingly, while a decrease in the current amplification factor is avoided, the base-emitter capacitance of the HBT is increased, to increase the efficiency of the HBT. In addition, the doping concentration of the emitter layer in a portion near the interface between the emitter layer and the base layer can be made lower than the doping concentration of the emitter layer of the existing HBT. Thus, an HBT can be provided that has an increased efficiency while suppressing a decrease in the base-emitter reverse breakdown voltage.

The emitter layer may have a thickness of 20 nm or more and 60 nm or less, or 20 nm or more and 40 nm or less. Incidentally, the thickness of the emitter layer is not limited to these ranges.

In the HBTs 100, 200, and 300, the emitter layer is constituted by plural layers including a lower layer 5a and an upper layer 5b having a higher doping concentration than the lower layer 5a. Incidentally, the configuration of the emitter layer is not limited to these embodiments.

In the HBTs 100, 200, and 300, the upper layer 5b may have a thickness of 5 nm or more and 26/(t/30) nm or less. In this case, an increase in the value of resistance is suppressed and degradation of the HBT performance is avoided.

In the HBTs 100, 200, and 300, the doping concentration of the upper layer 5b is not particularly limited, and may be, for example, $7.5 \times 10^{17}$ cm$^{-3}$ or more.

In the HBTs 200 and 300, the emitter layer includes, between the lower layer 5a and the upper layer 5b, the intermediate layer $5m_1$ or $5m_2$, which has a doping concentration higher than the doping concentration of the lower layer 5a and lower than the doping concentration of the upper layer 5b. This enhances the degree of freedom of designing of the doping concentration distribution. Accordingly, compared with the HBT 100, the doping concentration of the upper layer 5b can be further increased, to thereby further increase the base-emitter capacitance Cbe.

In the HBTs 400 and 500, the emitter layer includes a concentration gradient layer whose doping concentration continuously changes from the base layer side toward the semiconductor layer side of the concentration gradient layer. This enhances the degree of freedom of designing the doping concentration distribution. Accordingly, compared with the HBT 100, the doping concentration of the upper region of the emitter layer can be further increased, to thereby further increase the base-emitter capacitance Cbe.

In the HBTs 200, 300, 400, and 500, the formula (12) is satisfied where t (nm) represents the thickness of the emitter layer; x (nm) represents a distance in the concentration gradient layer, from the interface between the emitter layer and the semiconductor layer; N(x) represents the doping concentration distribution of the concentration gradient layer; $\Phi_s$ represents the surface potential of the emitter layer; represents the dielectric constant of the emitter layer; and $\in$ represents an electron elementary charge. In this case, even when the doping concentration of the emitter layer is made higher than that of the existing HBT, the ledge region is maintained to be fully depleted.

In the HBTs 300 and 500, the emitter layer includes a lower region, an intermediate region, and an upper region in this order from the base layer side toward the semiconductor layer side of the emitter layer; and the intermediate region has a higher gradient of the doping concentration than the lower region and the upper region. In this case, the emitter layer has a doping concentration distribution similar to that of the bilayer structure. Accordingly, the ledge region is maintained to be fully depleted, and the base-emitter reverse breakdown voltage can be increased.

The HBT 100 satisfies the formula (7) where t (nm) represents the thickness of the emitter layer 5; $t_H$ (nm) represents the thickness of the upper layer 5b; $N_{dL}$ (cm$^{-3}$) represents the doping concentration of the lower layer 5a; $N_{dH}$ (cm$^{-3}$) represents the doping concentration of the upper layer 5b; $\Phi_s$ represents the surface potential of the emitter layer 5; $\in$ represents the dielectric constant of the emitter layer 5; and q represents an electron elementary charge. In this case, even when the emitter layer is formed so as to have a higher doping concentration than in the existing HBT, the ledge region is maintained to be fully depleted.

In the HBTs 100, 200, 300, 400, and 500, the second region e2 of the emitter layer is fully depleted. In this case, generation of a conductive region in the ledge region is avoided. Thus, while a decrease in the current amplification factor is suppressed, the HBTs have an increased efficiency.

Incidentally, this Specification describes some embodiments in which the emitter layer includes plural layers having different doping concentrations or a concentration gradient layer whose doping concentration continuously changes. However, the structure of the emitter layer is not limited to these embodiments. For example, the emitter layer may be formed so as to include a combination of such plural layers and such a concentration gradient layer.

The combination of the materials for the emitter layer 5 and the base layer 4 is not limited to the above-described combination of InGaP and GaAs. Other examples of such combinations for heterojunctions include AlGaAs and GaAs; InP and InGaAs; InGaP and GaAsSb; InGaP and InGaAsN; Si and SiGe; and AlGaN and GaN.

The embodiments have been described for aiding ready understanding of the present disclosure and not for limiting the scope of the present disclosure. The present disclosure can be modified or improved without departing from the spirit and scope of the present disclosure. The present disclosure encompasses equivalents thereof. In other words, the embodiments that are appropriately changed by those skilled in the art also fall within the scope of the present disclosure as long as the resultant embodiments satisfy the features of the present disclosure. For example, the elements of the embodiments and the configurations, materials, conditions, shapes, and sizes of the elements are not limited to the above-described examples and can be appropriately changed. The elements of the embodiments can be combined as long as such combinations are technically feasible. Such combinations that satisfy the features of the present disclosure also fall within the scope of the present disclosure.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A heterojunction bipolar transistor comprising:
   a collector layer, a base layer, an emitter layer, and a semiconductor layer that are laminated in this order, wherein
   the emitter layer includes a first region having an upper surface on which the semiconductor layer is laminated, and a second region being adjacent to the first region and having an upper surface that is exposed with respect to the semiconductor layer,
   the first and second regions of the emitter layer have higher doping concentrations in portions near the upper surfaces than in portions near an interface between the emitter layer and the base layer so as to avoid generation of a conductive region in the second region of the emitter layer and to maintain the second region of the emitter layer to be fully depleted, the emitter layer contains a same main component in both the portions near the upper surfaces and the portions near an interface between the emitter layer and the base layer, and the portions near the upper surfaces have lower doping concentrations than the semiconductor layer.

2. The heterojunction bipolar transistor according to claim 1, wherein the emitter layer has a thickness of 20 nm or more and 60 nm or less.

3. The heterojunction bipolar transistor according to claim 1, wherein the emitter layer has a thickness of 20 nm or more and 40 nm or less.

4. The heterojunction bipolar transistor according to claim 1, wherein the first and second regions of the emitter layer include a plurality of layers including a lower layer and an upper layer that is laminated nearer to the semiconductor layer than the lower layer, and the upper layer has a doping concentration higher than a doping concentration of the lower layer.

5. The heterojunction bipolar transistor according to claim 4, wherein the upper layer has a thickness of 5 nm or more and $26/(t/30)$ nm or less where t represents a thickness of the emitter layer.

6. The heterojunction bipolar transistor according to claim 4, wherein the upper layer has a doping concentration of $7.5 \times 10^{17}$ cm$^{-3}$ or more.

7. The heterojunction bipolar transistor according to claim 4, wherein the first and second regions of the emitter layer include an intermediate layer between the lower layer and the upper layer, and the intermediate layer has a doping concentration higher than the doping concentration of the lower layer and lower than the doping concentration of the upper layer.

8. The heterojunction bipolar transistor according to claim 1, wherein the first and second regions of the emitter layer include a concentration gradient layer whose doping concentration continuously changes from a base layer side toward a semiconductor layer side of the emitter layer.

9. The heterojunction bipolar transistor according to claim 7, wherein the emitter layer includes, from a base layer side toward a semiconductor layer side of the emitter layer, a lower region, an intermediate region, and an upper region, and the intermediate region has a higher gradient of a doping concentration than the lower region and the upper region.

10. The heterojunction bipolar transistor according to claim 8, wherein the emitter layer includes, from a base layer side toward a semiconductor layer side of the emitter layer, a lower region, an intermediate region, and an upper region, and the intermediate region has a higher gradient of a doping concentration than the lower region and the upper region.

11. The heterojunction bipolar transistor according to claim 4, satisfying $$\Phi_s \geq \frac{qN_{dH}t_H^2}{2\varepsilon} + \frac{qN_{dL}(t^2 - t_H^2)}{2\varepsilon}$$

where t represents a thickness of the emitter layer; $t_H$ represents a thickness of the upper layer; $N_{dL}$ represents the doping concentration of the lower layer; $N_{dH}$ represents the doping concentration of the upper layer; $\Phi_s$ represents a surface potential of the emitter layer; $\varepsilon$ represents a dielectric constant of the emitter layer; and q represents an electron elementary charge.

12. The heterojunction bipolar transistor according to claim 1, wherein the second region of the emitter layer is covered by an insulating film.

13. The heterojunction bipolar transistor according to claim 12, wherein the insulating film includes a SiN film.

14. The heterojunction bipolar transistor according to claim 1, wherein at least one main component of the semiconductor layer differs from main components of the emitter layer.

15. The heterojunction bipolar transistor according to claim 1, wherein the emitter layer is InGaP.

16. The heterojunction bipolar transistor according to claim 15, wherein the semiconductor layer has a lower region contacting the emitter layer, and the lower region is GaAs.

17. The heterojunction bipolar transistor according to claim 4, wherein at least one main component of the semiconductor layer differs from main components of the emitter layer.

18. The heterojunction bipolar transistor according to claim 4, wherein the emitter layer is InGaP.

19. The heterojunction bipolar transistor according to claim 18, wherein the semiconductor layer has a lower region contacting the emitter layer, and the lower region is GaAs.

20. The heterojunction bipolar transistor according to claim 1, wherein a doping concentration of the portions near the upper surfaces is $3 \times 10^{18}$ cm$^{-3}$ or less.

21. The heterojunction bipolar transistor according to claim 1, wherein a doping concentration of the portions near the upper surfaces is $7.5 \times 10^{17}$ cm$^{-3}$ or more and $3 \times 10^{18}$ cm$^{-3}$ or less.

* * * * *